United States Patent [19]
Chapman et al.

[11] Patent Number: 5,684,421
[45] Date of Patent: Nov. 4, 1997

[54] COMPENSATED DELAY LOCKED LOOP TIMING VERNIER

[75] Inventors: Douglas J. Chapman, Lake Oswego, Oreg.; Jeffrey D. Currin, Pleasanton, Calif.

[73] Assignee: Credence Systems Corporation, Fremont, Calif.

[21] Appl. No.: 542,518

[22] Filed: Oct. 13, 1995

[51] Int. Cl.$^6$ .................... H03K 5/13; H03K 5/26
[52] U.S. Cl. .................... 327/261; 327/158; 327/236; 327/270; 327/284
[58] Field of Search ........................ 327/141, 146, 327/147, 149, 150, 152, 153–156, 158, 159, 161–163, 261, 276–278, 280, 281, 284, 233, 234–235, 236, 237, 243, 244, 245, 292, 270, 271

[56] References Cited

U.S. PATENT DOCUMENTS

| | | | |
|---|---|---|---|
| 3,199,037 | 8/1965 | Graves | 327/244 |
| 3,781,470 | 12/1973 | Horn | 327/244 |
| 4,341,999 | 7/1982 | Rudish et al. | 327/236 |
| 4,652,778 | 3/1987 | Hosoya et al. | 327/237 |
| 4,663,541 | 5/1987 | Larrowe | 327/237 |
| 4,902,986 | 2/1990 | Lesmeister | 331/25 |
| 4,912,433 | 3/1990 | Motegi et al. | 331/8 |
| 5,146,121 | 9/1992 | Searles et al. | 327/244 |
| 5,283,631 | 2/1994 | Koerner et al. | 307/451 |
| 5,336,940 | 8/1994 | Sorrells et al. | 327/276 |
| 5,365,130 | 11/1994 | Murray et al. | 327/237 |
| 5,440,514 | 8/1995 | Flannagan et al. | 327/250 |
| 5,486,783 | 1/1996 | Baumert et al. | 327/159 |

OTHER PUBLICATIONS

Chapman, Jim, *High Performance CMOS–Based VLSI Testers: Timing Control and Compensation*, IEEE International Test Conference Paper 3.1, 1992, pp. 59–66.

Kim, B. Helman, D., and Gray, P.R., *A 30MHz High–Speed Analog/Digital PLL in 2 Micron CMOS*, pp. 1–13, published on or before Feb. 16, 1994.

*Primary Examiner*—Timothy P. Callahan
*Assistant Examiner*—Eunja Shin
*Attorney, Agent, or Firm*—Smith-Hill and Bedell

[57] ABSTRACT

A timing vernier produces a set of timing signals of similar frequency and evenly distributed in phase by passing an input reference clock signal through a succession of delay stages, each stage providing a similar signal delay. A separate one of the timing signals is produced at the output of each delay stage. The reference clock signal and timing signal output of the last delay stage are supplied as inputs to a phase lock controller through separate adjustable first and second delay circuits. The phase lock controller controls the delay of all stages so that the timing signal output of the last stage is phase locked to the reference clock. In accordance with the invention, the delays of the first and second delay circuits are adjusted to compensate for controller phase lock error.

17 Claims, 5 Drawing Sheets

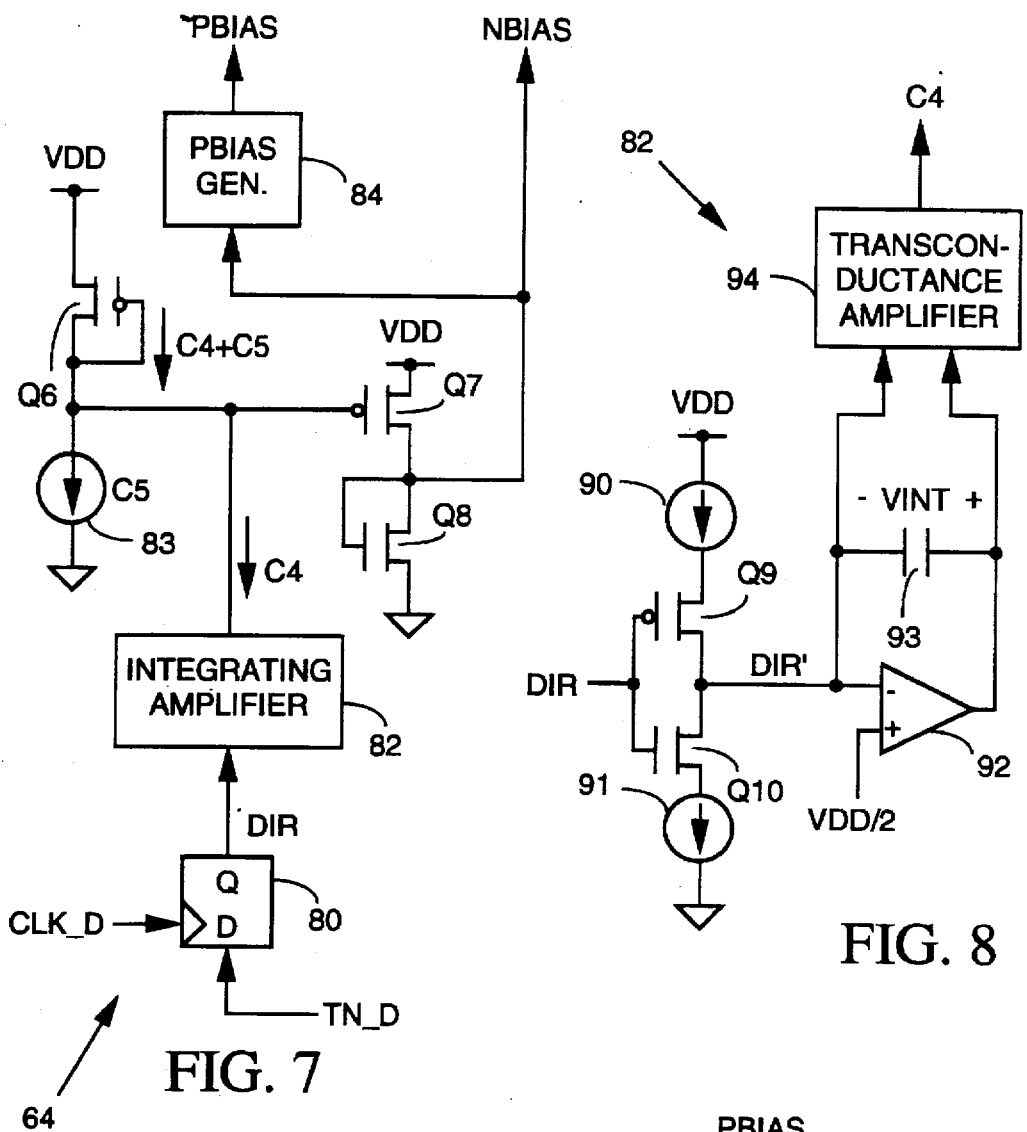
FIG. 7
FIG. 8
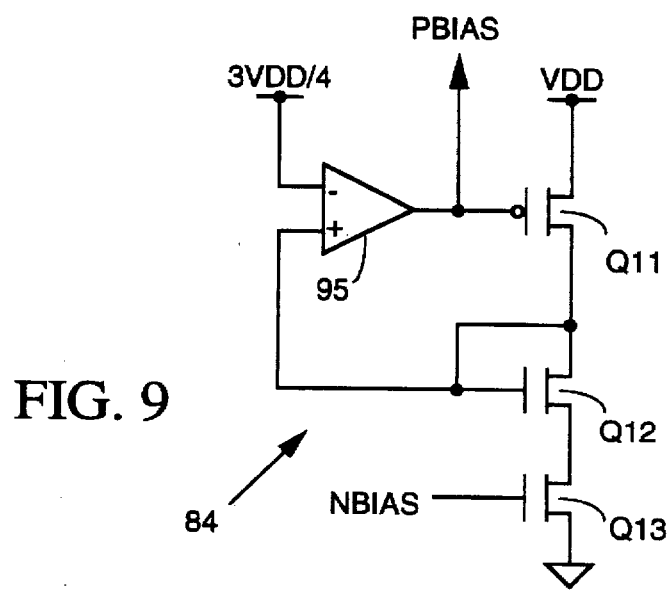
FIG. 9

COMPENSATED DELAY LOCKED LOOP TIMING VERNIER

BACKGROUND OF THE INVENTION

1. Field of the Invention

The present invention relates in general to timing signal generators and in particular to a timing vernier for generating a set of timing signals that are evenly distributed in phase with respect to a reference clock signal.

2. Description of Related Art

An integrated circuit tester transmits test signals to an integrated circuit and samples output signals produced by an integrated circuit at precisely controlled times. Testers usually time signal generation and sampling with reference to a global clock signal distributed to all system modules. Where high resolution in timing control is needed a tester could transmit a high frequency reference clock signal to all modules. But to avoid difficulties associated with high frequency signal transmission, a relatively low frequency reference clock signal is sent to a timing vernier within each module. A timing vernier produces a set of timing signals that are evenly shifted in phase from the reference clock signal so as to divide the period of the reference clock into several time slots.

A paper entitled "High-Performance CMOS-Based VLSI Testers:Timing Control and Compensation" by Jim Chapman discusses alternative designs for a timing vernier.

In one timing vernier design, as illustrated in FIG. 10 herein, a ring oscillator 100 is formed by a set of inverters connected in series to form a loop. The timing signals T1-TN are generated at the outputs of each inverter in the loop and are evenly shifted in phase. A phase lock controller 101 produces an output signal VPLL for controlling the frequency of oscillator 100 so that it matches the frequency of a reference clock (CLOCK). Controller 101 includes a phase detector 102 for comparing one of the oscillator 100 output taps to the reference clock signal. Detector 102 asserts an output signal PU when the tap lags the reference clock signal and asserts an output signal PD when the tap leads the reference clock signal. A charge pump 103 charges a capacitor 104 when PU is asserted and discharges the capacitor when PD is asserted. A unity gain amplifier 105 amplifies the voltage across capacitor 104 to produce the VPLL control voltage. To minimize phase jitter (variation in oscillator frequency) capacitor 104 must be relatively large and may be too large to be incorporated into an integrated circuit with the rest of the timing vernier.

The Chapman paper also discusses an alternative timing vernier design as illustrated in FIG. 11 wherein a reference clock signal passes through an inverter chain 110. Here too, the timing signals T1-TN are generated at the inverter outputs. A phase lock controller 111 (similar to controller 101 of FIG. 10) produces an output signal VDLL for controlling the switching speed of inverters 110 so as to phase lock the last inverter chain output signal TN to the reference clock (CLOCK). Since the reference clock signal must pass through inverter chain 110 in one cycle of the reference clock, the timing signals are evenly distributed in phase. This circuit has less phase jitter than the circuit of FIG. 10 and can produce similar results with a smaller filter capacitance which can be implemented within an integrated circuit. However a main source of inaccuracy of the circuit of FIG. 11 is the inability of controller 111 to precisely phase lock the inverter chain output to the reference clock. Any phase lock error will result in an uneven phase distribution in the timing signals.

SUMMARY OF THE INVENTION

A timing vernier produces a set of timing signals of similar frequency and evenly distributed in phase by passing an input reference clock signal through a succession of delay stages, each stage providing a similar signal delay. A separate one of the timing signals is produced at the output of each delay stage. The reference clock signal and timing signal output of the last delay stage are supplied as inputs to a phase lock controller through separate adjustable first and second delay circuits. The phase lock controller controls the delay of all stages so that the timing signal output of the last stage is phase locked to the reference clock. In accordance with the invention, the delays of the first and second delay circuits may be adjusted to compensate for controller phase lock error.

It is accordingly an object of the invention to provide a timing vernier for producing a set of timing signals that are evenly distributed in phase and which evenly divide the period of a reference clock signal into several intervals.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawings wherein like reference characters refer to like elements.

BRIEF DESCRIPTION OF THE DRAWING(S)

FIG. 7 illustrates the phase lock controller of FIG. 5 in combination block and schematic diagram form;

FIG. 8 illustrates the integrating amplifier of FIG. 7 in schematic diagram form;

FIG. 9 illustrates the PBIAS generator circuit of FIG. 7 is schematic diagram form;

DESCRIPTION OF THE PREFERRED EMBODIMENT(S)

Figure 1:
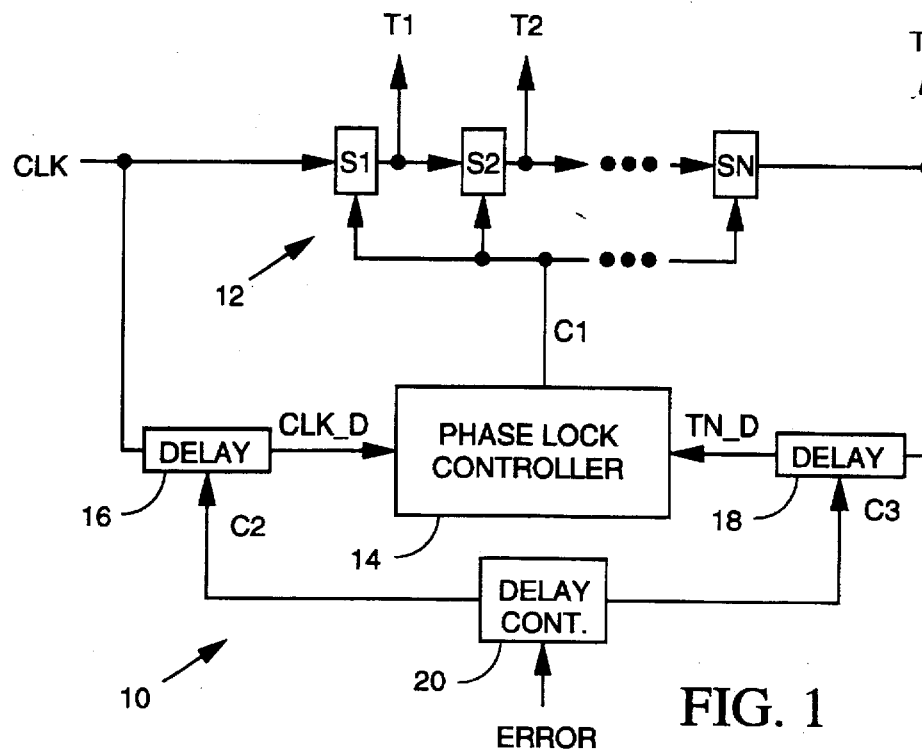
FIG. 1 illustrates in block diagram form a timing vernier in accordance with the present invention.

FIG. 1 illustrates a timing vernier 10 in accordance with the present invention. Timing vernier 10 produces a set of N single-ended timing signals T1-TN having the same frequency as a single-ended reference clock signal CLK but which are evenly distributed in phase. In particular, leading edges of timing signals T1-TN evenly divide the period of the reference clock signal into N intervals.

The reference clock signal CLK is applied as input to a delay chain 12 consisting of a set of N similar delay stages S1-SN connected in series. Stage S1 receives as its input the reference clock signal CLK and produces as its output timing signal T1 by delaying the reference clock signal. Each subsequent stage S2-SN produces a corresponding output timing signal T2-TN by delaying the timing signal output T1-T(N-1) of the preceding delay stage. Each delay stage S1-SN delays its input signal by a similar amount of time. A phase lock controller 14 adjusts the delay time with a control signal C1 applied to all stages. Each stage S1-SN may, for example, be an inverter or other logic element having a switching speed controlled by the magnitude of C1 which acts as the inverter power supply.

Phase lock controller 14 receives a delayed version CLK_D of the reference clock signal CLK produced by an adjustable delay circuit 16. Controller 14 also receives a delayed version TN_D of the TN timing signal output of stage SN via another adjustable delay circuit 18. Phase lock controller 14 adjusts the C1 signal so that timing signal TN_D is substantially phase locked to the reference clock signal CLK_D. When CLK leads TN_D, phase lock controller 14 alters C1 so as to decrease the delay in stages S1-SN. When the TN_D signal leads CLK_D, phase lock controller 14 alters C1 so as to increase the delay in stages S1-SN. If the delays of delay circuits 16 and 18 are similar, and if TN_D is precisely phase locked to CLK_D, then TN will be phase locked to CLK. In such case timing signals T1-TN will be evenly distributed in phase and leading edges of signals T1-TN evenly divide the period of the reference clock signal into N intervals.

However, though phase lock controller 14 "substantially" phase locks TN_D to CLK_D, it does not "precisely" phase lock TN_D to CLK_D. Phase lock controllers typically exhibit varying amounts of phase lock error. A steady state phase lock error is defined as a phase difference between TN and CLK after C1 reaches a steady value when circuits 16 and 18 provide similar delays. In accordance with the invention, adjustable delay circuits 16 and 18 are provided to compensate for phase lock error of phase lock controller 14, thereby improving the phase lock between CLK and TN.

A user may adjust the delays provided by delay circuits 16 and 18 by supplying input data (ERROR) to a delay controller 20. Controller 20 responds to the ERROR data by adjusting magnitudes of output signals C2 and C3 which control the delays of delay circuits 16 and 18, respectively. At a mid-point value of ERROR, C2 and C3 are of equivalent magnitude and delay circuits 16 and 18 provide similar delays. If the value of ERROR is increased, delay controller 20 adjusts C2 and C3 to increase the delay provided by delay circuit 18 and to decrease the delay provided by delay controller 16. Conversely, if the value of ERROR is deceased, delay controller 20 adjusts C2 and C3 to decrease the delay provided by delay circuit 18 and to increase the delay provided by delay controller 16. Thus a user employing, for example, an oscilloscope to compare the phases of CLK and TN can adjust the relative delays provided by delay circuits 16 and 18 by adjusting the ERROR data so as to reduce or eliminate any phase difference between CLK and TN due to phase lock error.

Figure 2:
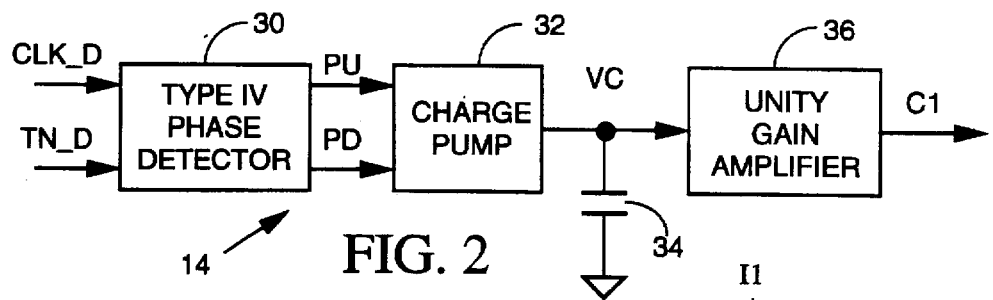
FIG. 2 illustrates the phase lock controller of FIG. 1 in more detailed block diagram form.

FIG. 2 illustrates a circuit suitable for use as phase lock controller 14. A type IV phase detector 30 compares the phases of CLK_D and TN_D, asserting a "pull up" signal PU when CLK_D leads TN_D and asserting a "pull down" signal PD when CLK_D lags TN_D. A charge pump 32 receives the PU and PD signals. Charge pump 32 continuously supplies charge to increase the voltage across a capacitor 34 when PU is asserted and continuously discharges capacitor 34 while PD is asserted to decrease the voltage across capacitor 34. A unity gain amplifier 36 amplifies the voltage across capacitor 34 to produce C1. Thus the magnitude of C1 is proportional to the time integral of the phase difference between CLK_D and TN_D.

Figures 3, 4:
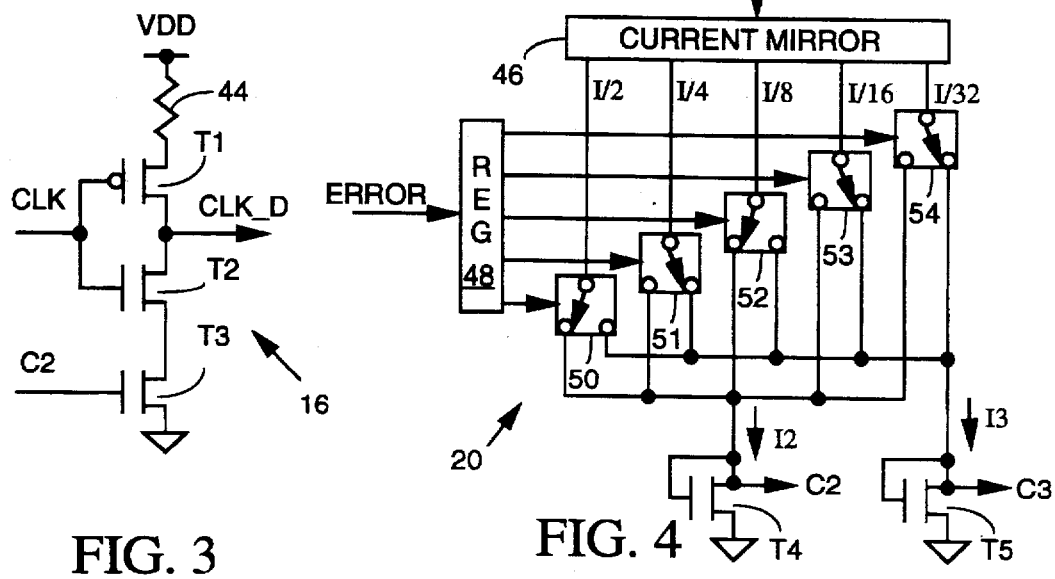
FIG. 3 illustrates a typical delay stage of FIG. 1 in schematic diagram form.
FIG. 4 illustrates the delay controller of FIG. 1 in more detailed block diagram form.

FIG. 3 illustrates a suitable implementation of delay circuit 16 in more detailed block diagram form. (Delay circuit 18 is similar.) Delay circuit 16 includes a pmos transistor T1 and two nmos transistors T2 and T3. A resistor 44 couples the source of transistor T1 to a voltage source VDD. The drain of transistor T1 is connected to the drain of transistor T2 and the source of transistor T2 is connected to the drain of transistor T3. The source of transistor T3 is grounded. The reference clock signal CLK drives the gates of transistors T1 and T2 while the C2 signal drives the gate of transistor T3. The CLK_D signal appears at the drain of transistor T1. The magnitude of C2 controls the current dram by current source transistor T3 and therefore the switching speed (or delay time) of the inverter. When a greater range of delay is required, additional inverter stages can be added to delay circuits 16 and 18.

FIG. 4 illustrates delay controller 20 of FIG. 1 in more detailed block diagram form. Controller 20 includes a current mirror circuit 46 receiving an input current I1 of magnitude I and producing a set of five output currents of magnitudes 1/2, 1/4, 1/8, 1/16 and 1/32. The five output currents of current mirror 46 are each separately directed by one of switches 50-54 into drains of a selected one of diode connected transistors T4 and T5. The sum of currents directed into transistor T4 form output current I2 while the sum of currents directed into transistor T5 form output current I2. The sources of transistors T4 and T5 are grounded. The C2 signal appears at the drain of transistor T4 and the C3 signal appears at the drain of transistor T5. The sum of I2 and I3 is a constant equal to (31/32)I1.

The ratio of I2 to I3 is determined by user- supplied ERROR data stored in a register 48. Each bit of the 5- bit ERROR data controls the switching state of a separate one of switches 50-54. Since transistor T4 is similar to transistor T3 of delay circuit 16 of FIG. 3, the current drawn by current source transistor T3 is I2. Thus the delay of delay circuit 16 is proportional to I2 which is determined by the ERROR data. A similar current source transistor within delay circuit 18 of FIG. 1 is controlled by C3 and draws current I3. Thus the delay provided by delay circuit 18 of FIG. 1 is also controlled by the ERROR data.

Figure 5:
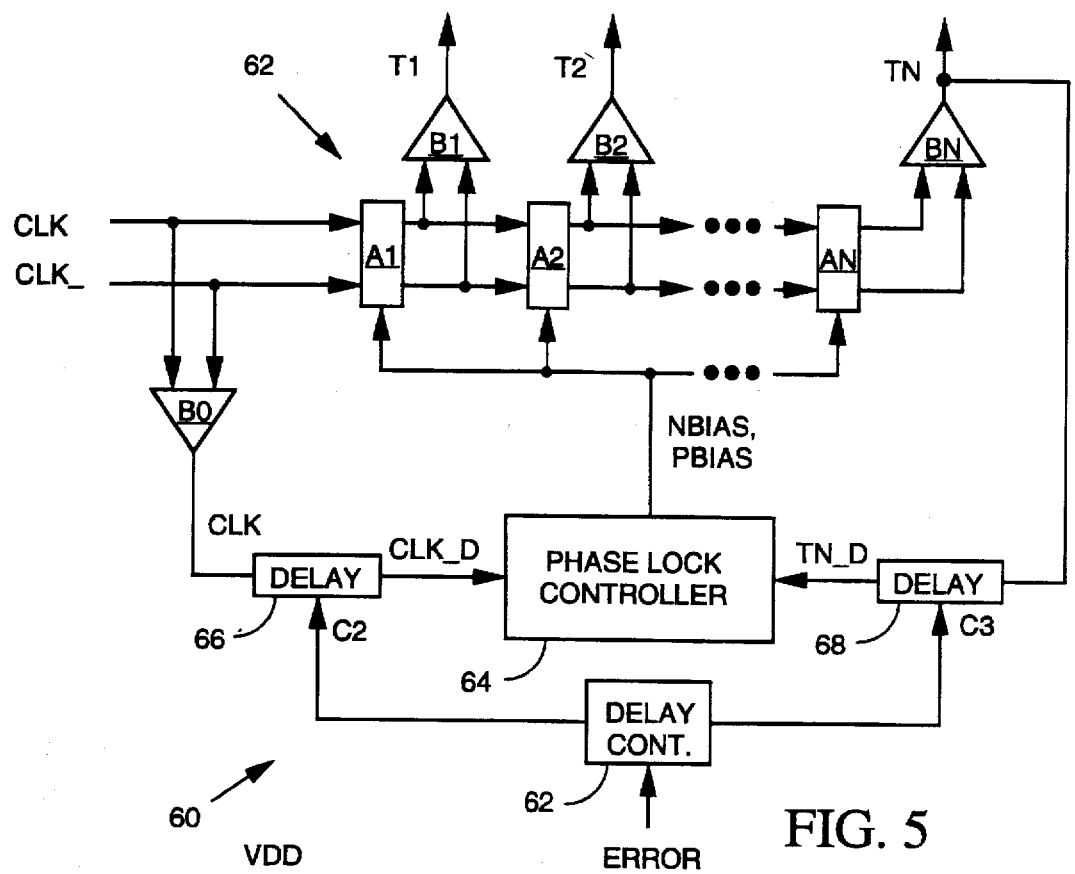
FIG. 5 illustrates in block diagram form an alternative embodiment of a timing vernier in accordance with the present invention.

FIG. 5 illustrates an alternative embodiment of the invention in which the reference clock signal CLK/CLK_ is a differential signal and delay stages A1-AN are differential delay elements. The differential version of the invention illustrated in FIG. 5 is less subject to signal degradation than the single- ended version of FIG. 1, particularly when a large number of delay elements are used. The differential version is also less sensitive to power supply and threshold voltage changes and is less sensitive to process variations.

In the embodiment of FIG. 5 the set of N delay stages A1-AN are connected in series, each stage producing a differential output signal by delaying a deferential input signal. Stage A1 receives the differential reference clock signal CLK/CLK_ as its input. A set of buffers B1-BN are provided to convert the differential outputs of stages A1-AN to single-ended timing signals T1-TN. An additional buffer B0 converts the differential clock signal CLK/CLK_ to a single-ended reference clock signal CLK. Delay circuit 66 delays the CLK signal to produce a CLK_D output signal while delay circuit 68 delays TN to produce a TN_D output signal. Delay circuits 66 and 68 of FIG. 5 are similar to delay circuits 16 and 18 of FIG. 1 as detailed in FIG. 2 and may also be adjusted to compensate for phase lock error of a phase lock controller 64 which controls the delay of stages A1-AN with a control signal NBIAS. A PBIAS output signal controls logic levels of the stages A1-AN. The delay of delay circuit 66 is controlled by an input control signal C2 while the delay of delay circuit 67 is controlled by an input control signal C3. A delay controller 60 similar to controller 20 of FIG. 4 adjusts voltages of C2 and C3 in accordance with input ERROR data to adjust delays of circuits 66 and 68.

Figure 6:
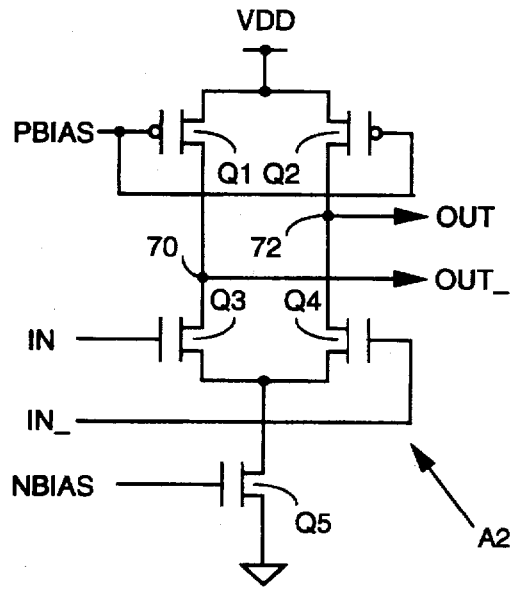
FIG. 6 illustrates a typical delay stage of FIG. 5 in schematic diagram form.
Figure 10:
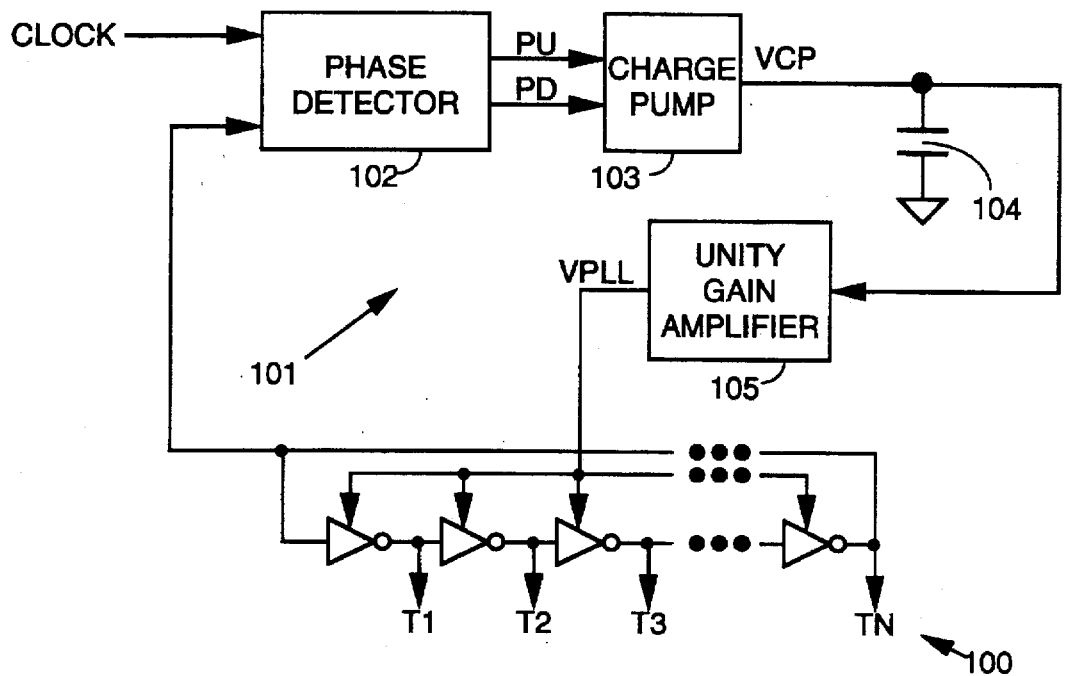
FIGS. 10 and 11 illustrate prior art timing verniers.
Figure 11:
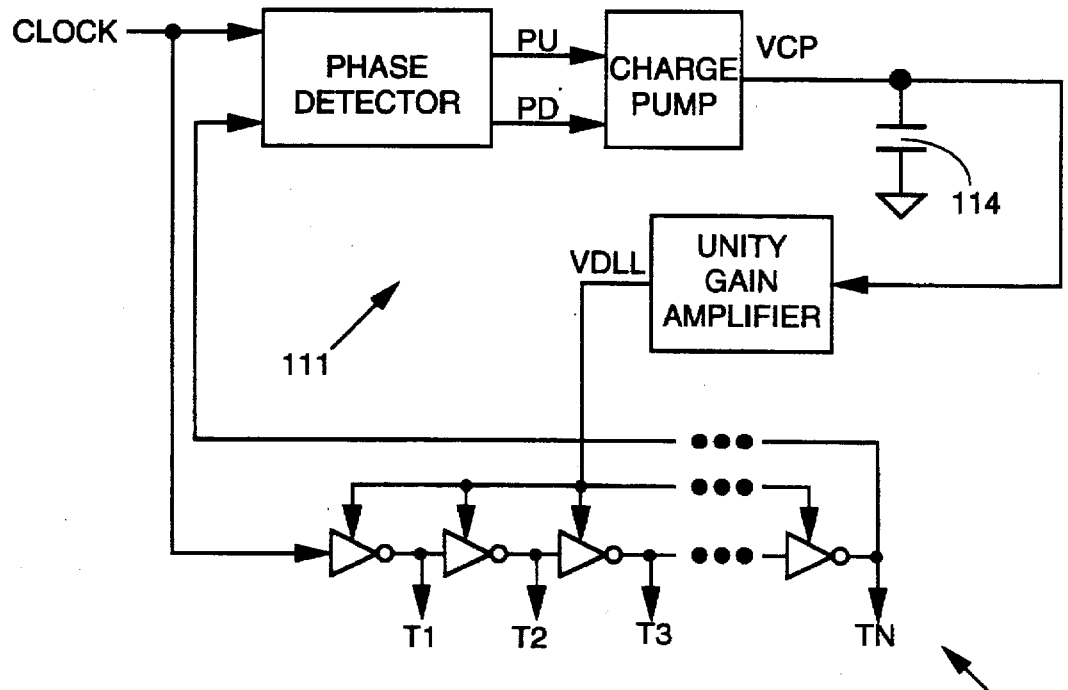

FIG. 6 illustrates a preferred embodiment of differential delay stage A2 of FIG. 5 in more detail. Stages A1 and A3-AN are similar. Referring to FIG. 6, stage A2 is a differential element formed by pmos transistors Q1 and Q2 and nmos transistors Q3-Q5. Transistors Q1 and Q2 have sources connected to power supply VDD. Current source transistor Q5 has source connected to ground supply. The sources of transistors Q3 and Q4 are tied to the drain of transistor Q5. The drain of transistor Q3 is tied to the drain of transistor Q1 at node 70 while the drain of transistor Q4 is tied to the drain of transistor Q2 at node 72. The differential stage output signal OUT/OUT_ appears between nodes 70 and 72. The differential stage input signal IN/IN_ is applied across the gates of transistors Q3 and Q4. A signal PBIAS connected to gates of transistors Q1 and Q2 controls their impedance. The NBIAS signal tied to the gate of current source transistor Q5 controls the current it draws. When IN goes high and IN_ goes low, OUT goes high and OUT_ goes low. When IN swings low and IN_ swings high, OUT goes low and OUT_ goes high. As explained below, the value of PBIAS is set to ensure that OUT/OUT_ swings between VDD and ¾ VDD. The magnitude of NBIAS controls the switching speed of the stage and therefore controls the stage delay. If NBIAS is increased, the current through transistors Q1-Q5 increases. With more current available for charging inherent circuit capacitance after IN/IN_ changes state, OUT/OUT_ changes state more quickly. Thus as NBIAS increases the stage delay decreases.

FIG. 7 illustrates phase lock controller 64 of FIG. 5. The CLK_D output of delay circuit 66 controls the clock input of a type D flip-flop 80 and the TN_D output of delay circuit 68 of FIG. 5 controls the D input. The Q output of flip-flop 80 produces an indicating signal DIR that oscillates between high and low logic levels depending on the state of TN_D when CLK_D last clocked flip-flop 80. The DIR signal is supplied to an integrating amplifier 82 which produces an output current signal C4. C4 steadily increases when DIR is low and steadily decreases when DIR is high. The output of amplifier 82 is tied to the drain and source of a diode-connected pmos transistor Q6 and the gate of a pmos transistor Q7 and to a fixed current source 83. The fixed current source carries a current C5 which will flow between node 85 and ground. Current C5 will be summed with the C4 output current and this summation current will flow through transistor Q6. The sources of transistors Q6 and Q7 are both tied to VDD. The gates of Q6 and Q7 are tied together. Thus, the current in Q6 will be mirrored in Q7. The drain of transistor Q7 is tied to the drain and gate of a diode-connected nmos transistor Q8. Transistor Q8 is similar in size to transistor Q5 of FIG. 6. The delay provided by each delay stage A1-AN of FIG. 5 is proportional to NBIAS. NBIAS swings with current C4. Current C5 is sized to bias NBIAS to a nominal condition. The phase lock controller circuit 64 of FIG. 7 adjusts NBIAS so that CLK_D is in phase with TN_D. The NBIAS signal is also supplied to a "PBIAS" generator circuit 84 producing the PBIAS signal input for delay stages A1-AN of FIG. 5. As explained below, PBIAS controls the voltage swing of the stage output signals. When the feedback loop provided by circuit 64 reaches equilibrium after system startup, the controller will bring TN_D and CLK_D substantially in phase (subject to phase lock error), with the phase of TN_D oscillating only slightly about that of CLK_D. The C4, NBIAS, and PBIAS signals will be held substantially constant.

FIG. 8 illustrates the integrating amplifier 82 of FIG. 7. The DIR signal drives the gates of pmos transistor Q9 and nmos transistor Q10 having interconnected drains. A current source 90 connects the source of transistor Q9 to VDD while a similar current source 91 couples the source of transistor Q10 to ground. Transistors Q9 and Q10 have similar channel widths. A signal DIR' appearing at a junction between the drains of transistors Q9 and Q10 swings about VDD/2 in response to changes in state of DIR. DIR' and a voltage equal to VDD/2 drive inverting and non-inverting inputs of a differential amplifier 92. Amplifier 92 serves to keep its inverting input at a voltage VDD/2. When the signal DIR is high, Q9 is off, Q10 is on, and the current from current source 91 charges capacitor 93; this will cause the VINT voltage across capacitor 93 to increase. When the signal DIR is low, Q9 is on, Q10 is off, and the current from current source 90 discharges capacitor 93. This causes the VINT voltage across capacitor 93 to decrease. A transconductance amplifier 94 amplifies VINT to produce the output current C4. TN_D is substantially in phase with CLK_D when the time integral of DIR is equal to VDD/2. When TN_D starts to lead CLK_D, the time integral of DIR will fall below VDD/2 and the discharging current from current source 90 will dominate the charging current from current source 91, causing both the VINT voltage across capacitor 93 and the current C4 to decrease. The decreasing C4 current will thereby decrease the stage delay so as to increase the period of TN-D and to bring it substantially in phase with CLK_D.

FIG. 9 illustrates the PBIAS generator circuit 84 of FIG. 7 in schematic diagram form. Circuit 84 includes a pmos transistor Q11 similar in size to transistors Q1 and Q2 of FIG. 6, an nmos transistor Q12 similar in size to transistors Q3 and Q4 of FIG. 6, and an nmos transistor Q13 similar to transistor Q5 of FIG. 6. The source of transistor Q11 is connected to VDD and the drain of transistor Q11 is connected to the gate and drain of transistor Q12. The source of transistor Q12 is connected to the drain of transistor Q13, and the source of transistor Q13 is connected to ground. The NBIAS signal controls the gate of transistor Q13. A reference voltage of magnitude equivalent to three fourths VDD is supplied to an inverting input of an amplifier 95. The drain of transistor Q12 is tied to a non-inverting input of amplifier 95. The output of amplifier 95 produces the PBIAS signal and also drives the gate of transistor Q11. Amplifier 95 holds the voltage at the drain of transistor Q11 to three fourths of VDD regardless of the current drawn by transistor Q13. Referring to FIGS. 6 and 9, since transistors Q5 and Q13 are similar and are both controlled by NBIAS, they draw similar currents. Either transistors Q3 and Q4 may be on depending on the state of IN/IN_. When transistor Q3 is on the current drawn by transistor Q5 is delivered by transistor Q1. Transistors Q11 and Q1 are similar and are controlled by the same signal PBIAS. Transistors Q12 and Q3 are similar in size and are both on. While transistors Q13 and Q5 are similar in size and are both controlled by NBIAS. Thus since the drop across transistor Q11 is ¼ VDD, the drop across transistor Q1 must also be ¼ VDD and OUT_ is at ¾ VDD. Transistor Q2, also active, pulls OUT near VDD. When IN/IN_ changes state, transistor Q4 turns on and transistor Q3 turns off. OUT falls to ¾ VDD while OUT_ rises to near VDD.

Figure 12:
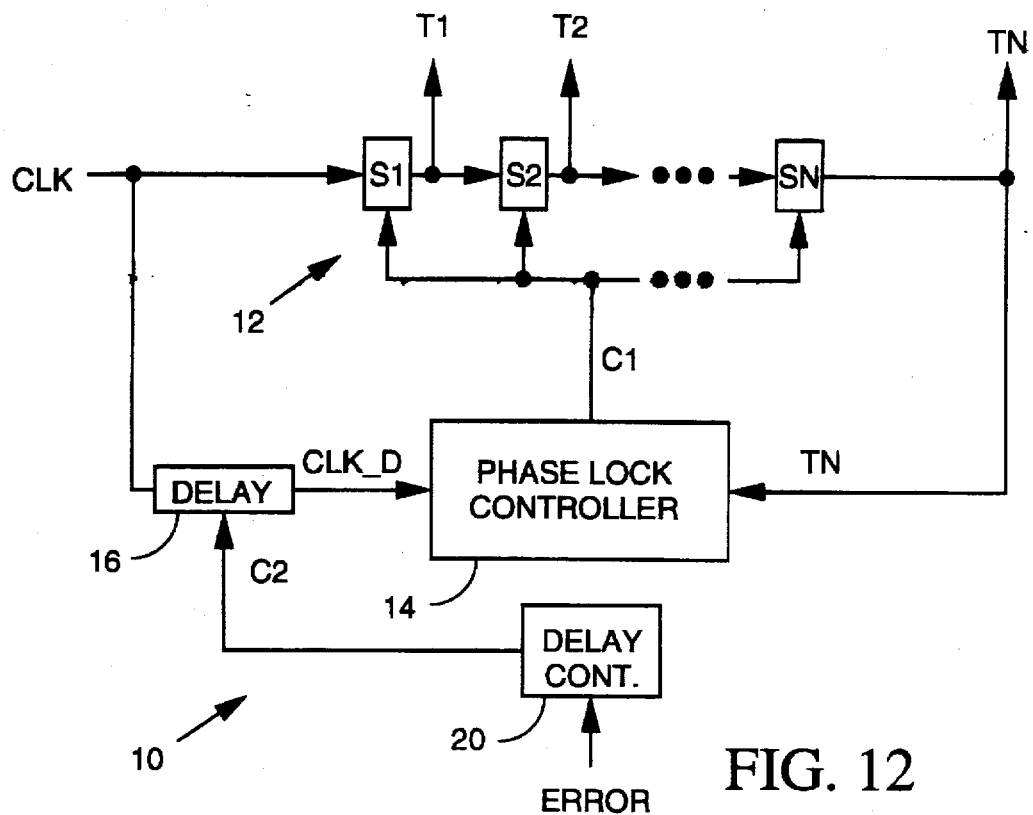
FIGS. 12 and 13 illustrate alternative embodiments of the timing vernier in accordance with the present invention.
Figure 13:
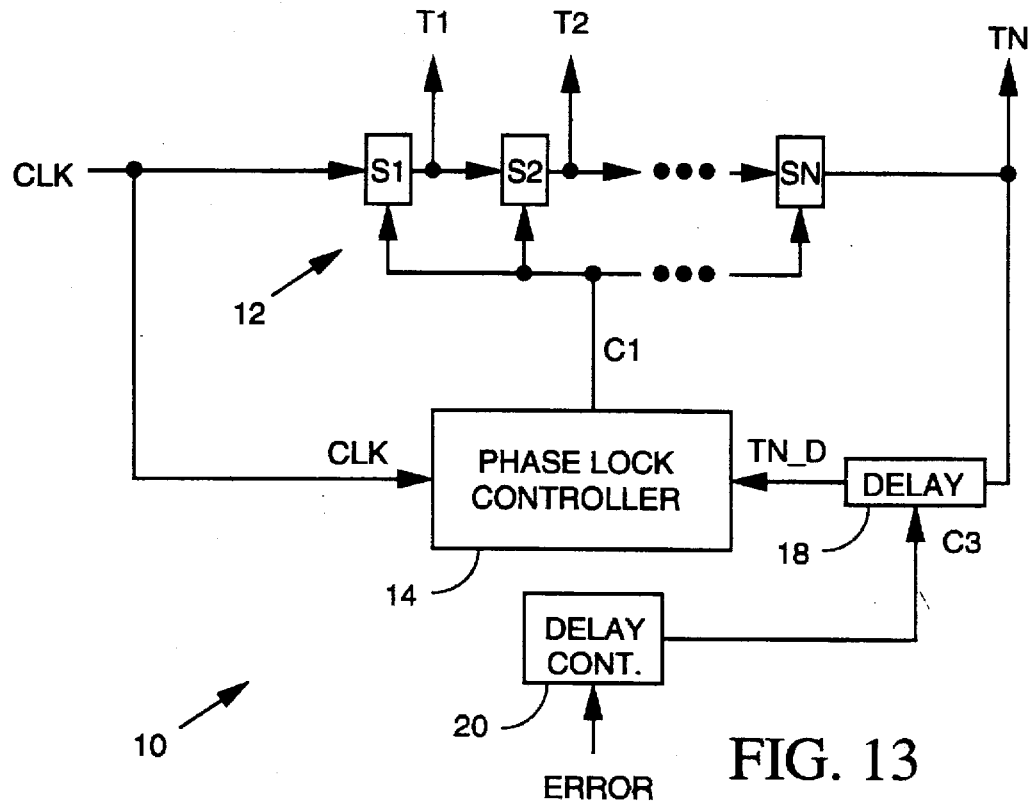

FIGS. 12 and 13 illustrate alternative embodiments of the timing vernier in accordance with the present invention. FIGS. 12 and 13 are generally similar to FIG. 1 and similar elements are identified by similar reference characters. However in FIG. 12 delay circuit 18 has been omitted and in FIG. 13 delay circuit 16 has been omitted. In the circuits of FIG. 12 and 13 phase lock error may be reduced by adjusting the remaining delay circuit 16 or 18.

Thus has been described a compensated delay-locked loop timing vernier in accordance with the present invention. While the forgoing specification has described preferred embodiment(s) of the present invention, one skilled in the art may make many modifications to the preferred embodiment without departing form the invention in its broader aspects. The appended claims therefore are intended to cover all such modifications as fall within the true scope and spirit of the invention.

What is claimed is:

1. An apparatus for phase locking a periodic output signal of a circuit to a periodic input signal of the circuit, wherein a phase relation between the input and output signals is determined by a magnitude of a control signal supplied to the circuit, the apparatus comprising:

means for delaying the input signal by an adjustable first delay time to produce a first reference signal;

means for delaying the output signal by an adjustable second delay time to produce a second reference signal;

means for adjusting the control signal magnitude so as to substantially phase lock the second reference signal to the first reference signal; and means for adjusting said first and second delay times so as to phase lock the output signal to said input signal.

2. A phase lock controller for a first delay circuit producing a periodic first output signal by delaying a periodic first reference signal by a first delay time determined by a magnitude of a first control signal supplied as input thereto, the phase lock controller receiving input control data and adjusting the magnitude of said first control signal so as to phase lock said first output signal to said first reference signal, the phase lock controller comprising:

a second delay circuit for producing a periodic second reference signal by delaying said periodic first reference signal by a second delay time determined by a magnitude of a second control signal supplied as input thereto;

a third delay circuit for producing a periodic third reference signal by delaying said periodic first output signal by a third delay time determined by a magnitude of a third control signal supplied as input thereto;

first control means for receiving said second and third reference signals and adjusting the magnitude of said first control signal so as to substantially phase lock said third reference signal to said second reference signal; and second control means for receiving said input control data, and adjusting the magnitude of said second and third control signals in accordance with said input control data.

3. The phase lock controller in accordance with claim 2 wherein a sum of said second and third delay times is a constant while a ratio of said second and third delay times varies with said input control data.

4. The phase lock controller in accordance with claim 2 wherein said second control means comprises:

second and third nodes;

means for producing a plurality of first currents;

switch means for selectively routing each of said first currents to one of said second and third nodes in accordance with said input control data thereby to produce a second current at said second node being a sum first currents routed thereto and a third current at said third node being a sum of first currents routed thereto, such that a sum of said second and third currents is a constant and such that a ratio of said first and second currents varies with said input control data; and means for adjusting magnitudes of said second and third control signals in proportion to said second and third currents, respectively.

5. A timing vernier responsive to a periodic differential reference signal for generating a plurality of periodic timing signals regularly distributed in phase, the timing vernier comprising:

a plurality of delay elements coupled in series, wherein a first delay element of said series receives and delays said differential reference signal to produce a differential output signal, wherein each subsequent delay element of said series produces a separate differential output signal by receiving and delaying a differential output signal of a preceding delay element of said series, wherein a delay of each delay element is controlled by a magnitude of a control signal supplied to each delay element;

means for deriving each of said timing signals from a separate one of the differential output signals produced by said delay elements;

means receiving the differential reference signal for producing as output a first reference signal having an adjust&hie phase relationship with said differential reference signal;

means receiving a timing signal derived from the differential output signal of a last delay element of said series for producing as output a second reference signal having an adjustable phase relationship with said timing signal; and means receiving said first and second reference signals and adjusting said control signal to bring phase lock said second reference signal to said first reference signal.

6. A timing vernier for generating a plurality of periodic timing signals regularly distributed in phase comprising:

means for producing a first output signal of a succession of output signals by delaying a periodic first reference signal by an adjustable first delay time, means for producing each successive output signal of said succession other than said first output signal by delaying a preceding output signal of said succession by said adjustable first delay time, means for producing a periodic second reference signal by delaying said first reference signal by an adjustable second delay time, means for producing a periodic third reference signal by delaying a last output signal of said succession by an adjustable third delay time, means for adjusting said first delay time so as to substantially phase lock said third reference signal to said second reference signal, and means for adjusting the second and third delay times so as to phase lock said last output signal to said first reference signal.

7. The timing vernier in accordance with claim 6 further comprising means for generating each of said timing signals in response to a separate one of said output signals.

8. A timing vernier responsive to a periodic first reference signal and input control data for generating a plurality of periodic timing signals regularly distributed in phase, the timing vernier comprising:

- a first delay circuit producing a periodic output signal by delaying said first reference signal by a first delay time determined by a magnitude of a first control signal supplied as input thereto;
- a second delay circuit producing a periodic second reference signal by delaying said periodic first reference signal by a second delay time determined by a magnitude of a second control signal supplied as input thereto;
- a third delay circuit producing a periodic third reference signal by delaying said periodic output signal by a third delay time determined by a magnitude of a third control signal supplied as input thereto;
- first control means for receiving said second and third reference signals, supplying said first control signal to said first delay circuit, and adjusting the magnitude of said first control signal so as to substantially phase lock said third reference signal to said second reference signal; and
- second control means for receiving said input control data and adjusting the magnitudes of said second and third control signals in accordance with said input control data.

9. The timing vernier in accordance with claim 8 wherein said second control means adjusts said second and third delay times such that their sum is a constant and such that a ratio of said second and third delay times varies with said input control data.

10. The timing vernier in accordance with claim 8 wherein said second control means comprises:

- second and third nodes;
- means for producing a plurality of first currents;
- switch means for selectively routing each of said first currents to one of said second and third nodes in accordance with said input control data thereby to produce a second current at said second node being a sum of ones of first currents routed thereto and a third current at said third node being a sum of first currents routed thereto, wherein a sum of said second and third currents is a constant and wherein a ratio of said first and second currents varies with said input control data; and
- means for producing said second and third control signals having magnitudes proportional to said second and third currents, respectively.

11. The timing vernier in accordance with claim 8 wherein said first delay circuit comprises a plurality of delay elements connected to form a series of delay elements each producing as output a separate one of said timing signals, wherein a first delay element of said series receives and delays said first reference signal to produce a first one of said timing signals and such that each subsequent delay element of said series produces its output timing signal by receiving and delaying an output timing signal produced by a preceding delay element of said series, the periodic output signal being derived from the timing signal produced by a last delay element of said series.

12. The timing vernier in accordance with claim 11 wherein the magnitude of said first control signal controls a delay of each of said delay elements of said series.

13. The timing vernier in accordance with claim 8 wherein said first reference signal is a differential signal, wherein said first delay circuit comprises:

- a plurality of differential delay elements connected to form a series of delay elements, wherein a first delay element of said series receives and delays said first reference signal to produce a differential output signal, wherein each subsequent delay element of said series produces a separate differential output signal by receiving and delaying an output signal of a preceding delay element of said series; and
- means for generating said timing signals from the differential output signals produced by said delay elements and for generating said first delay circuit output signal from a differential output of a last delay element of said series.

14. The timing vernier in accordance with claim 13 wherein said first control means comprises:

- phase comparison means for generating a signal of magnitude indicating a phase relation between said second and third reference signals;
- integrating means generating a fourth control signal of magnitude that varies with a time integral of said indicating signal; and
- means for producing said first control signal of magnitude determined by the magnitude of said fourth control signal.

15. A method for phase locking a periodic output signal of a circuit to a first reference signal supplied as input to the circuit, wherein a phase relation between the output signal and the first reference signal is determined by a magnitude of a control signal supplied to the circuit, the method comprising the steps of:

- delaying the first reference signal by a first adjustable delay time to produce a second reference signal;
- delaying the circuit output signal by a second adjustable delay time to produce a third reference signal;
- adjusting the control signal magnitude so as to substantially phase lock the third reference signal to the second reference signal; and
- adjusting said first and second delay times so as to phase lock the circuit output signal to said first reference signal.

16. A method for generating a plurality of periodic timing signals regularly distributed in phase, comprising the steps of:

- producing a first of a succession of output signals being produced by delaying a periodic first reference signal by an adjustable first delay time,
- producing each successive one of said output signals other than said first output signal by delaying a preceding one of said output signals by said adjustable first delay time,
- producing a periodic second reference signal by delaying said first reference signal by an adjustable second delay time;
- producing a periodic third reference signal by delaying a last output signal of said succession by an adjustable third delay time;
- adjusting said first delay time so as to substantially phase lock said third reference signal to said second reference signal; and adjusting the second and third delay times so as to phase lock said last output signal to said first reference signal.

17. An apparatus for phase locking a periodic output signal of a circuit to a periodic input signal of the circuit, wherein a phase relation between the input an output signals is determined by a magnitude of a first control signal supplied to the circuit, the apparatus comprising:

first means for delaying the output signal by an adjustable delay time to produce a reference signal, said adjustable delay time being set by a magnitude of a second control signal supplied to said first means;

second means for adjusting the first control signal magnitude so as to substantially phase lock the input signal to the reference signal; and third means for adjusting said second control signal magnitude to set said adjustable delay time so as to phase lock the output signal to the input signal, wherein said second and third means independently adjust said first control signal and said second control signal.

* * * * *